US008488056B2

(12) United States Patent
Halliday et al.

(10) Patent No.: US 8,488,056 B2
(45) Date of Patent: Jul. 16, 2013

(54) MODULAR CAMERA SYSTEM AND A METHOD OF MANUFACTURING THE SAME

(75) Inventors: William Halliday, Edinburgh (GB); Choon Kiat Ooi, Singapore (SG)

(73) Assignees: STMicroelectronics (R&D) Ltd., Marlow Bucks (GB); STMicroelectronics Asia Pacific Pte. Limited, Singapore (SG)

( * ) Notice: Subject to any disclaimer, the term of this patent is extended or adjusted under 35 U.S.C. 154(b) by 259 days.

(21) Appl. No.: 12/824,760

(22) Filed: Jun. 28, 2010

(65) Prior Publication Data
US 2010/0328526 A1 Dec. 30, 2010

(30) Foreign Application Priority Data
Jun. 29, 2009 (GB) .................................. 0911171.7

(51) Int. Cl.
*H04N 5/225* (2006.01)
(52) U.S. Cl.
USPC .......................................... 348/374; 348/373
(58) Field of Classification Search
USPC .......................................................... 348/374
See application file for complete search history.

(56) References Cited

U.S. PATENT DOCUMENTS

| 4,630,172 | A | * | 12/1986 | Stenerson et al. | ............ | 361/718 |
| 2002/0096753 | A1 | | 7/2002 | Tu et al. | ......................... | 257/680 |
| 2006/0219862 | A1 | | 10/2006 | Ho et al. | ..................... | 250/208.1 |
| 2007/0018263 | A1 | | 1/2007 | Noma | | |
| 2007/0165136 | A1 | * | 7/2007 | Wu et al. | ........................ | 348/373 |

FOREIGN PATENT DOCUMENTS
EP          1696489          1/2007

* cited by examiner

*Primary Examiner* — Tuan Ho
*Assistant Examiner* — Angel L Garces-Rivera
(74) *Attorney, Agent, or Firm* — Allen, Dyer, Doppelt, Milbrath & Gilchrist, P.A.

(57) ABSTRACT

A camera module includes a substrate with a cavity therein. A processor is located in the cavity, and wire bonding is for connecting the processor to the substrate. An imaging module is adapted to overlay the processor in the cavity and rest on at least part of the edge of the cavity. Wire bonding is for connecting the imaging module to the substrate and the processor. The cavity includes a longitudinal cutout section adapted to accommodate at least some wire bonding for connecting the processor to the substrate or associated surface mount components.

26 Claims, 5 Drawing Sheets

600

700 though it is understood ceramic may be replaced by other materials providing similar or equivalent properties. However, the cavity geometry is quite challenging to produce.

MODULAR CAMERA SYSTEM AND A METHOD OF MANUFACTURING THE SAME

FIELD OF THE INVENTION

The present invention relates to improvements in or relating to a modular camera system and a method of manufacturing the same.

BACKGROUND OF THE INVENTION

In the field of mobile communications the need for miniaturization and increased functionality and capability continues to grow. This has led to the desire to produce a functional camera system with an integrated image signal processor (ISP) in the camera module.

Traditionally, an integrated camera system has not been possible due to incompatibility between the imager and processor die sizes, power dissipation, and substrate tracking density. In addition, combinations of image and processor have not been possible due to tracking and bonding requirements and constraints imposed by existing volume manufacturing capabilities.

SUMMARY OF THE INVENTION

It is an object of the present invention to produce a modular camera system with an integrated ISP.

According to one aspect, there is a camera module comprising a substrate including a cavity therein. A processor is located in the cavity, and one or more connections are for connecting the processor to the substrates. An imaging module is adapted to overlay the processor in the cavity and rest on at least part of the edge of the cavity. One or more connections connect the imaging module to the substrate and the processor, and the cavity includes a longitudinal cutout section adapted to accommodate at least one of the one or more connections for connecting the processor to the substrate or to accommodate one or more associated surface mounted components.

This approach offers a number of benefits. It allows leverage of existing 3Mpix/5Mpix camera module designs. A high the level of functional integration is achieved. The design supports features of the processor as a stand-alone device. A single package solution is achieved which does not require a host system ISP. Imager/ISP integration is achieved in a single module. A complete approach is provided which can be tuned to optimize performance for the specific image/processor combination. The overall X/Y dimensions are smaller than that of a single die combining the imager and processor. A better isolation for noise and EMC purposes and an improved thermal performance is achieved. Application base-band processors can transfer more of the workload to the camera system. Flash and Shutter control can be achieved as an integrated capability thereby improving timing issues. There is an improved signaling environment between the imager and processor. Multiple image formats and images sizes are supported. An AF85 package size is achieved with a module height of less than 6 mm with a standard Voice Coil Motor (VCM) actuator. The architecture is completely adaptable to implement support for other actuator technologies. There is no increase in package dimensions over existing standard imager-only modules. It is possible to support at least one secondary camera module.

BRIEF DESCRIPTION OF THE DRAWINGS

Reference will now be made, by way of example, to the accompanying drawings, in which.

DETAILED DESCRIPTION OF THE PREFERRED EMBODIMENTS

The present invention relates to a multichip modular camera based on stacking die and cavity substrates and making variations which permit a viable cavity bonding arrangement to support the functional combination of an imager and processor in a single package.

The following description and associated drawings describe the assembly of the module in stages focusing on the multichip ceramic cavity approach implemented within the design.

Figure 1:
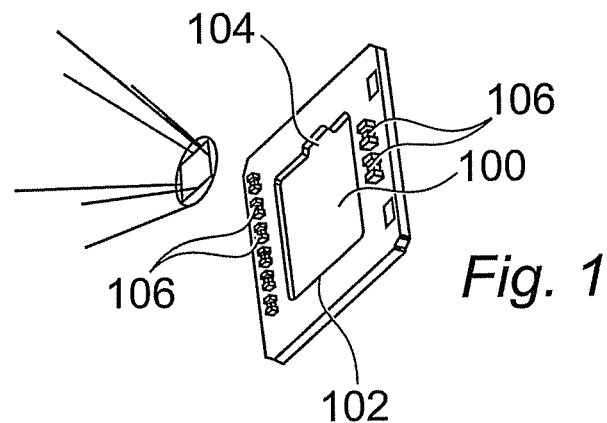
FIG. 1 is a diagram of a substrate of a camera module, in accordance with an embodiment of the invention, given by way of example.

FIG. 1 shows a metalized ceramic module (MCM) ceramic substrate 100. The substrate includes a cavity 102 which is shaped to include a notch or cutout section 104. The notch is preferably relatively narrow to avoid unnecessary stresses being placed on the substrate during reliability tests. A typical width of the notch is in the region of 1.5 mm. The cavity along with the notch is punched out of the substrate by means of an appropriately shaped punch tool, after which the substrate is fired before the next steps are carried out. The cavity is approximately 0.26 mm deep and shaped to offer a maximum support to the upper die whilst permitting maximum bonding height for the lower die. The notch 104 is particularly important in optimizing the support for the upper die and bonding from the lower die, as will be seen in greater detail below.

The particular ceramic material is selected for rigidity and flatness. Typical materials may include High or Low Temperature Co-fired Ceramics (HTCC/LTCC). These types of material are easier to machine in order to produce the cavity, as there tends to be less shredding of particles which might lead to unacceptable levels of contamination. The use of ceramic material also helps in dissipating heat from the module and prevents hotspots arising that might interfere with satisfactory performance of the image array. In addition, ceramic substrates may not use the solder masks typical of organic substrates which would be difficult to apply to a cavity design.

The cutout section 104 is located on an edge of the cavity along some, but not all, of its length. The notch extends longitudinally along the edge in question. There may be more than one notch on one edge or notches on more than one of the edges.

Certain surface mounted devices (SMD) 106 are mounted on the substrate. An example SMD is a correction circuit for correcting position of a flipped image array, as discussed below with respect to FIG. 5. The SMD components have been selected for their physical size and placed so that their placement complements with the placement and arrangement of the imager die and the actuator to ensure that the image array center is coincident with the package center.

Figure 2:
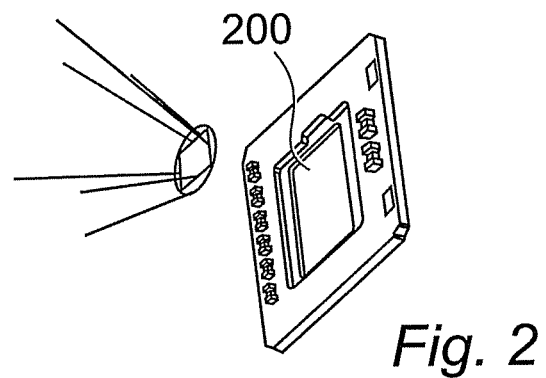
FIG. 2 is a diagram of the next stage of manufacture of the FIG. 1 module, in accordance with an embodiment of the invention, given by way of example.
Figure 3:
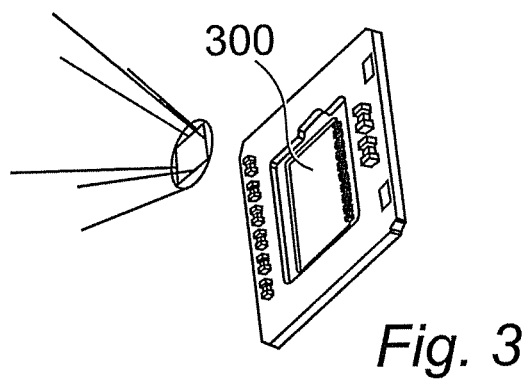
FIG. 3 is a diagram of the next stage of manufacture of the FIG. 1 module, in accordance with an embodiment of the invention, given by way of example

FIG. 2 shows the introduction of a processor 200 into the cavity. An example of an appropriate processor is an image signal processor such as a V0986 processor. The die is back-lapped to approximately 105μ thickness and bonded using an appropriate mechanism, such as glue or a die attach film. The exact position of the processor is determined by reference to the position of the imager die, in order to maintain optical concentricity and meet bonding requirements for the processor die. There is sufficient space within the cavity for surface mounted devices associated with the processor die particularly due to the fact that the notch provides additional available space. Any wire bonding at this stage is minimized in terms of height to keep the module height to the minimum. The wire bonding is shown as 300 in FIG. 3. It should be noted that the term wirebonding is used herein to cover any method or means of connection between different components, devices and substrates. Other examples of connections may include Through Silicon Vias (TSVs) or any other appropriate connection.

Figure 4:
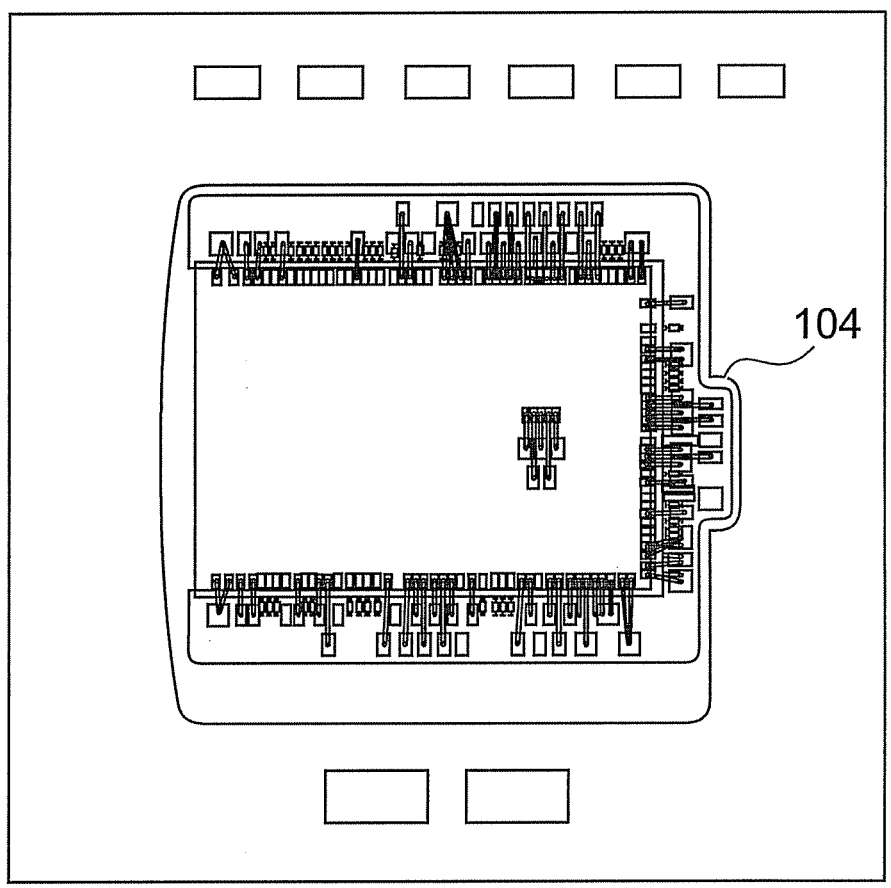
FIG. 4 is a diagram showing wire bonding for the module, in accordance with an embodiment of the invention, given by way of example.

FIG. 4 shows a more detailed schematic of the wire bonding for the chosen processor. This is a typical bonding arrangement and will vary according to the processor die used and on specific configurations requirements. However, it can be clearly seen that the notch 104 includes several rows of bond wires and therefore provides some additional capacity for bonding wires and other attachments. It is also feasible that Surface Mound Devices (SMD) could be positioned inside the cavity or inside the notch if the cavity depth is made greater than the height of the chosen SMD components.

Figure 5:
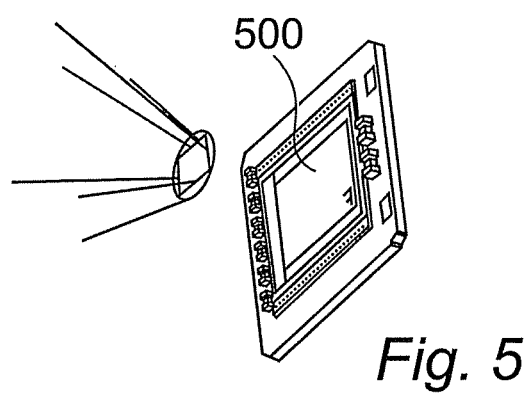
FIG. 5 is a diagram of the next stage of manufacture of the FIG. 1 module, in accordance with an embodiment of the invention, given by way of example.
Figure 6:
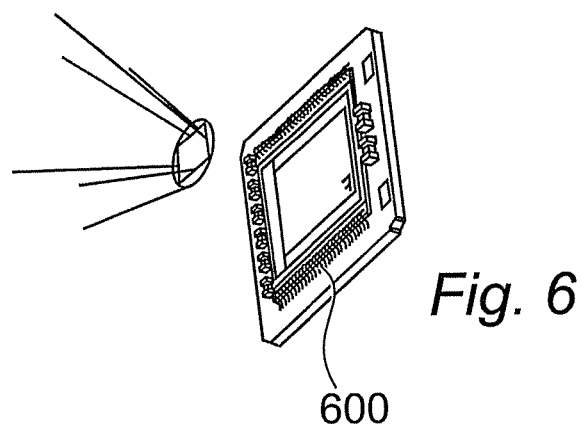
FIG. 6 is a diagram of the next stage of manufacture of the FIG. 1 module, in accordance with an embodiment of the invention, given by way of example.

Referring to FIG. 5 an imager die 500 is attached above the cavity (not shown) resting on a lip (not shown) surrounding the cavity. The imager includes an imager array made up of a plurality of pixels and may for example be an S952 or any other appropriate type. The imager array may be referred herein as an imaging module. The imager die may be rotated horizontally through 180° compared to traditional methods. This enables a better fit for subsequent actuators to the substrate. If this rotation occurs the image is then flipped onchip to correct for the effects of this placement by means of an onchip connection module or method. FIG. 6 shows wire bonding 600 for the imager die which again will vary depending on the imager die used and specific configurations requirements.

Figure 7:
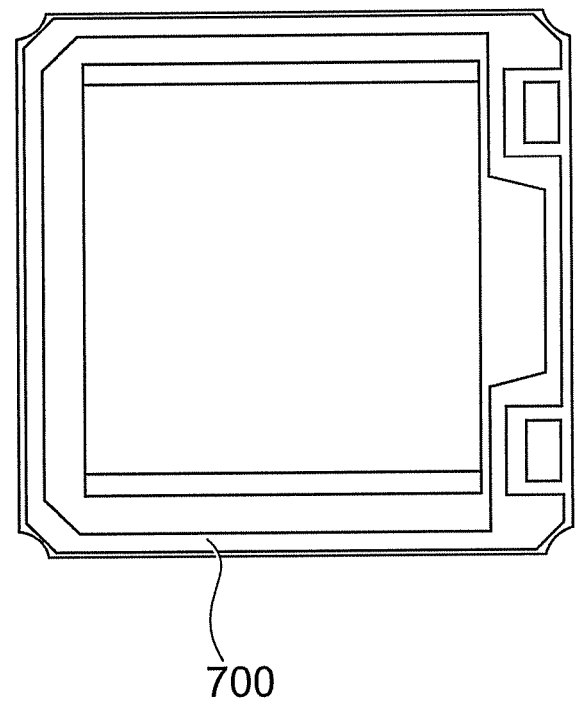
FIG. 7 is a diagram showing the glue pattern for an IR holder of the module, in accordance with an embodiment of the invention, given by way of example.

Referring to FIG. 7 the subsequent manufacturing step for the module will now be described in greater detail. FIG. 7 shows the glue pattern 700 to permit the attachment of an Infra-Red (IR) glass holder that helps protect the imager die from dust ingress which may contaminate the image array. The glue is a non-conductive glue containing spacer particles of approximately 30μ to ensure minimal tilt between the actuator and the substrate.

Figure 8:
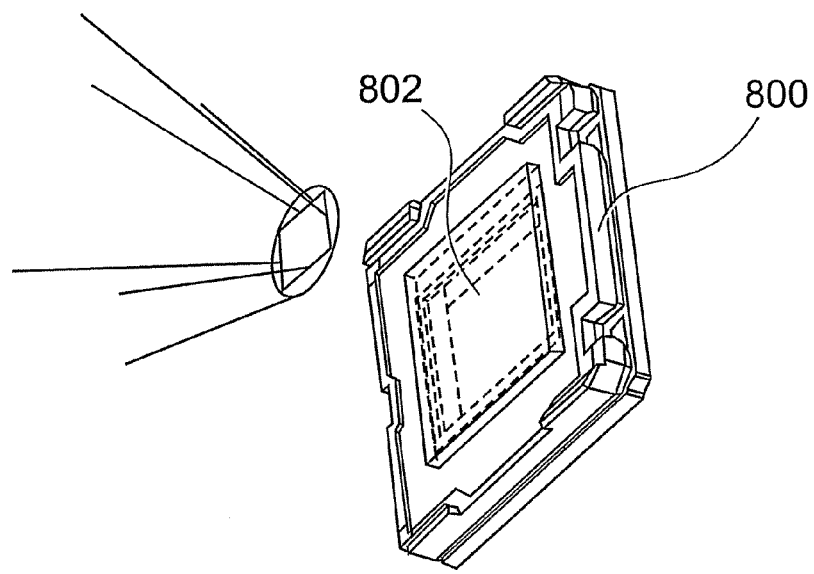
FIG. 8 is a diagram showing the attachment of the IR holder, in accordance with an embodiment of the invention, given by way of example.

Referring to FIG. 8, the IR glass holder 800 is shown fitted above the substrate assembly with an aperture 802 centered over the image array. As previously indicated the IR glass holder prevents dust ingress and protects the delicate image array during later stages in the assembly of the camera module. The IR holder is effectively a universal interface for different actuator designs to be attached thereto. The attachment can be made for two or more than two contacts.

Figure 9:
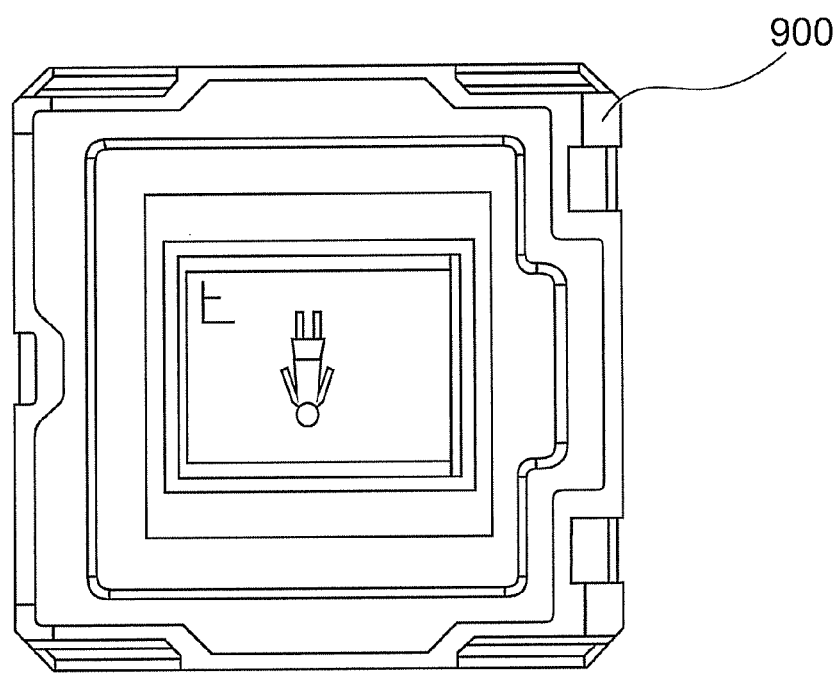
FIG. 9 is a diagram of a glue pattern for lens or actuator attachment in accordance with an embodiment of the invention, given by way of example.
Figure 10:
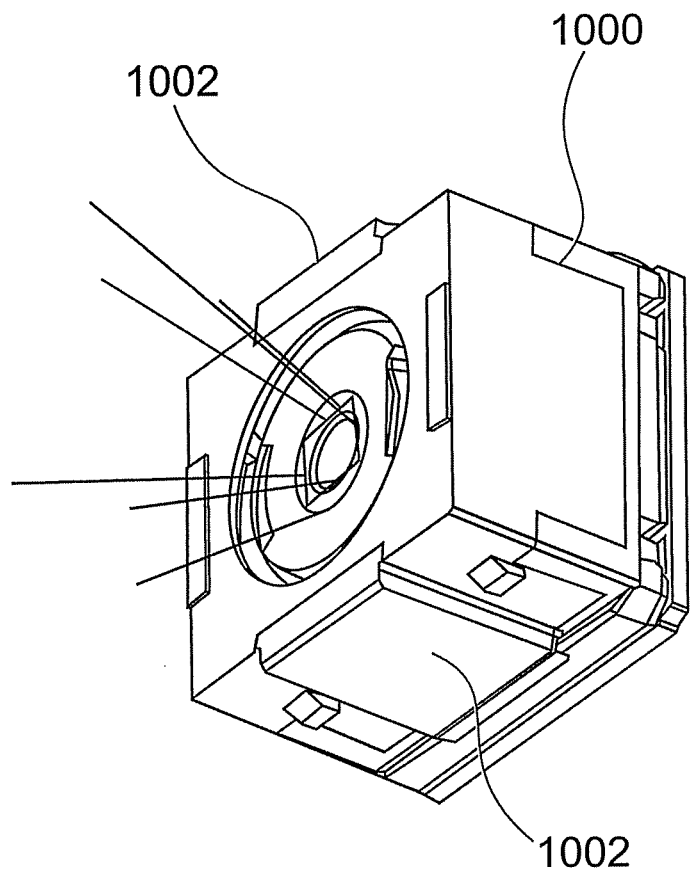
FIG. 10 is a diagram of the final camera module, in accordance with an embodiment of the invention, given by way of example.

The FIG. 9 is a diagram showing the glue pattern 900 for the lens or actuator attachment. The glue is a non-conductive glue and the glue pattern may be adjusted as necessary to suit the device. The lens or actuator assembly 1000 is then fitted over the top of the IR glass holder as shown in FIG. 10. Two electrical contacts 1002 between the lens actuator assembly and the ceramic substrate are also shown.

It will be appreciated that a number of variations can be made, for example, different materials and layouts of components. The notch 104 may take many different forms shapes and positions relative to the main cavity in the substrate. The build up of the different layers and components may also be varied in accordance with different requirements.

The camera module is suitable for use in any appropriate device, such as a mobile telephone, other personal or communications devices or in a camera itself.

That which is claimed is:

1. A camera module comprising:
a substrate having a cavity therein;
a processor located in the cavity;
at least one first connection for coupling said processor to said substrate;
an imaging module configured to overlay said processor in the cavity; and
at least one second connection for coupling said imaging module to said substrate and said processor;
the cavity having a plurality of edges and including at least one cutout section extending along at least one of the plurality of edges, with the at least one cutout section having a length less than a length of a respective one of the plurality of edges and configured to accept said at least one first connection.

2. The camera module of claim 1, wherein said at least one first connection comprises first wire bonds.

3. The camera module of claim 1, wherein said at least one second connection comprises second wire bonds.

4. The camera module of claim 1, wherein the at least one cutout section is also configured to accept at least one surface mounted component.

5. The camera module of claim 1, wherein the at least one cutout section comprises a plurality of longitudinal cutout sections extending along at least one of the plurality of edges of the cavity.

6. The camera module of claim 1, wherein each cutout section extends along a respective one of the plurality of edges.

7. The camera module of claim 1, wherein said substrate comprises a ceramic material.

8. The camera module of claim 1, wherein said processor comprises an image signal processor.

9. The camera module of claim 1, wherein said imaging module includes an imager array.

10. The camera module claim 1, wherein said imager array is positioned relative to said substrate so as to minimize an overall space occupied by said image array.

11. The camera module of claim 10, further comprising a correction circuit configured for correcting for a position of said image array.

12. The camera module of claim 10, wherein the cutout section has first and second edges, with the second edge being longer than the first edge.

13. The camera module of claim 12, wherein the first and second edges are linear.

14. A camera module comprising:
a substrate having a cavity therein;
a processor located in the cavity;
at least one first connection for coupling said processor to said substrate;
an imaging module configured to overlay said processor in the cavity; and
at least one second connection for coupling said imaging module to said substrate and said processor;
the cavity having a plurality of edges and including at least one cutout section extending along at least one of the plurality of edges, with the at least one cutout section having a length less than a length of a respective one of the plurality of edges and configured to accept at least one associated surface mounted component.

15. The camera module of claim 14, wherein said at least one first connection comprises first wire bonds.

16. The camera module of claim 14, wherein said at least one second connection comprises second wire bonds.

17. The camera module of claim 14, wherein the at least one cutout section comprises a plurality of longitudinal cutout sections extending along at least one of the plurality of edges of the cavity.

18. A method of making a camera module comprising:
forming a cavity in a substrate;
locating a processor in the cavity;
coupling the processor to the substrate using at least one first connection;
configuring an imaging module to overlay the processor in the cavity; and
coupling the imaging module to the substrate and the processor using at least one second connection;
the cavity having a plurality of edges and including at least one cutout section extending along at least one of the plurality of edges, with the at least one cutout section having a length less than a length of a respective one of the plurality of edges and configured to accept the at least one first connection.

19. The method of claim 18, wherein the at least one first connection comprises first wire bonds.

20. The method of claim 18, wherein the at least one second connection comprises second wire bonds.

21. The method of claim 18, wherein the at least one cutout section is also configured to accept at least one surface mounted component.

22. A method of making a camera module comprising:
forming a cavity in a substrate;
locating a processor in the cavity;
coupling the processor to the substrate using at least one first connection;
configuring an imaging module to overlay the processor in the cavity; and
coupling the imaging module to the substrate and the processor using at least one second connection;
the cavity having a plurality of edges and including at least one cutout section extending along at least one of the plurality of edges, with the at least one cutout section having a length less than a length of a respective one of the plurality of edges and configured to accept at least one associated surface mounted component.

23. The method of claim 22, wherein the at least one first connection comprises first wire bonds.

24. The method of claim 22, wherein the at least one second connection comprises second wire bonds.

25. The method of claim 22, wherein the at least one cutout section is also configured to accept at least one surface mounted component.

26. The method of claim 22, wherein the at least one cutout section comprises a plurality of longitudinal cutout sections extending at least one of the plurality of edges of the cavity.

* * * * *